(12) United States Patent
Venezia et al.

(10) Patent No.: US 8,183,510 B2
(45) Date of Patent: *May 22, 2012

(54) IMAGE SENSOR WITH BURIED SELF ALIGNED FOCUSING ELEMENT

(75) Inventors: Vincent Venezia, Sunnyvale, CA (US); Hsin-Chih Tai, San Jose, CA (US); Duli Mao, Sunnyvale, CA (US); Ashish Shah, Milpitas, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 389 days.

This patent is subject to a terminal disclaimer.

(21) Appl. No.: 12/559,307

(22) Filed: Sep. 14, 2009

(65) Prior Publication Data

US 2010/0038523 A1  Feb. 18, 2010

Related U.S. Application Data

(63) Continuation-in-part of application No. 12/030,055, filed on Feb. 12, 2008, now Pat. No. 7,589,306.

(51) Int. Cl.
*H01L 27/00* (2006.01)
*H01L 31/00* (2006.01)
*H01J 5/16* (2006.01)

(52) U.S. Cl. ............... 250/208.1; 250/216; 250/214.1; 257/432; 257/294; 257/460; 348/69

(58) Field of Classification Search ............ 250/208.1, 250/214.1, 216; 257/294, 432, 447, 460; 438/69, 70, 75

See application file for complete search history.

(56) References Cited

U.S. PATENT DOCUMENTS

| | | | | |
|---|---|---|---|---|
| 4,959,533 A | * | 9/1990 | Yamazaki et al. | 250/208.1 |
| 5,091,638 A | * | 2/1992 | Yamazaki et al. | 250/208.1 |
| 5,187,596 A | * | 2/1993 | Hwang | 358/484 |
| 5,363,216 A | * | 11/1994 | Kim | 358/482 |
| 6,104,021 A | * | 8/2000 | Ogawa | 250/208.1 |
| 6,221,687 B1 | * | 4/2001 | Abramovich | 438/70 |
| 6,674,061 B1 | * | 1/2004 | Arimoto | 250/208.1 |
| 7,262,073 B2 | * | 8/2007 | Baek et al. | 438/70 |
| 7,291,826 B2 | * | 11/2007 | Vaillant | 250/214.1 |
| 7,315,014 B2 | * | 1/2008 | Lee et al. | 250/208.1 |
| 7,531,884 B2 | * | 5/2009 | Kim | 257/440 |
| 7,589,306 B2 | * | 9/2009 | Venezia et al. | 250/208.1 |
| 7,968,923 B2 | * | 6/2011 | Nagaraja et al. | 257/294 |
| 8,054,371 B2 | * | 11/2011 | Wang et al. | 348/342 |
| 2001/0010952 A1 | * | 8/2001 | Abramovich | 438/151 |

(Continued)

OTHER PUBLICATIONS

Rhodes, H. et al, "CMOS Imager Technology Shrinks and Image Performance", Microelectronics and Electron Devices, 2004 IEEE Workshop on, 2004, pp. 7-18, ISBN: 0-7803-8369-9/04.

*Primary Examiner* — John Lee

(74) *Attorney, Agent, or Firm* — Blakely Sokoloff Taylor & Zafman LLP

(57) ABSTRACT

An image sensor includes an optical sensor region, a stack of dielectric and metal layers, and an embedded layer. The optical sensor is disposed within a semiconductor substrate. The stack of dielectric and metal layers are disposed on the front side of the semiconductor substrate above the optical sensor region. The embedded focusing layer is disposed on the backside of the semiconductor substrate in a Backside Illuminated (BSI) image sensor, supported by a support grid, or a support grid composed of the semiconductor substrate.

12 Claims, 10 Drawing Sheets

U.S. PATENT DOCUMENTS

| | | | |
|---|---|---|---|
| 2006/0033008 A1* | 2/2006 | Vaillant | 250/208.1 |
| 2006/0050397 A1* | 3/2006 | Oh et al. | 359/619 |
| 2006/0145216 A1* | 7/2006 | Lee | 257/294 |
| 2006/0169870 A1* | 8/2006 | Silsby et al. | 250/208.1 |
| 2007/0024926 A1* | 2/2007 | Chung | 358/482 |
| 2007/0035785 A1* | 2/2007 | Kuan | 358/474 |
| 2007/0152250 A1* | 7/2007 | Kim | 257/292 |
| 2008/0157142 A1* | 7/2008 | Park | 257/292 |
| 2008/0198454 A1* | 8/2008 | Wang et al. | 359/486 |
| 2008/0265348 A1* | 10/2008 | Maas et al. | 257/432 |
| 2009/0020842 A1* | 1/2009 | Shiau et al. | 257/459 |
| 2009/0057801 A1* | 3/2009 | Goushcha et al. | 257/437 |
| 2009/0200452 A1* | 8/2009 | Venezia et al. | 250/208.1 |
| 2009/0230394 A1* | 9/2009 | Nagaraja et al. | 257/59 |
| 2010/0038523 A1* | 2/2010 | Venezia et al. | 250/216 |

\* cited by examiner

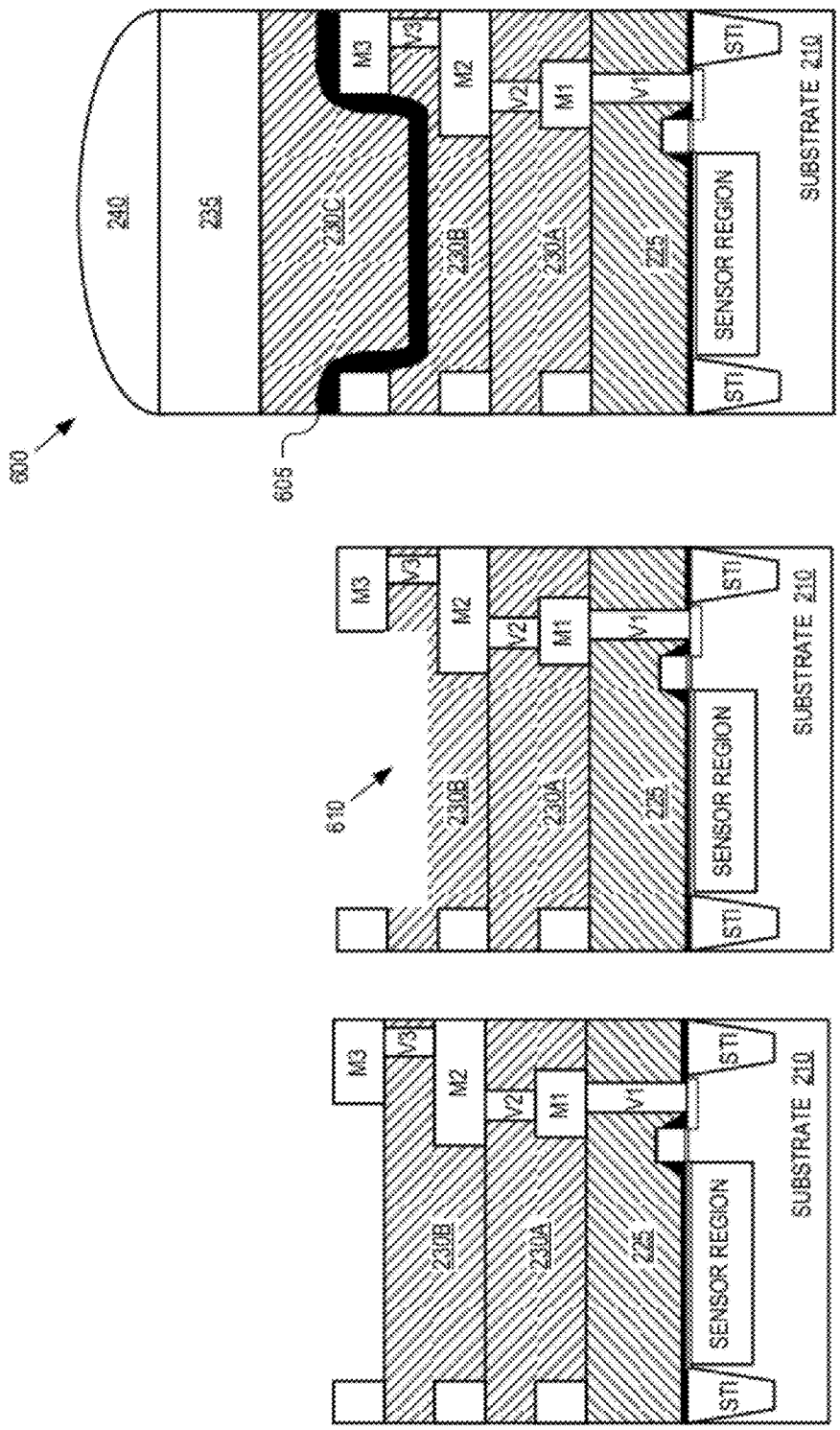

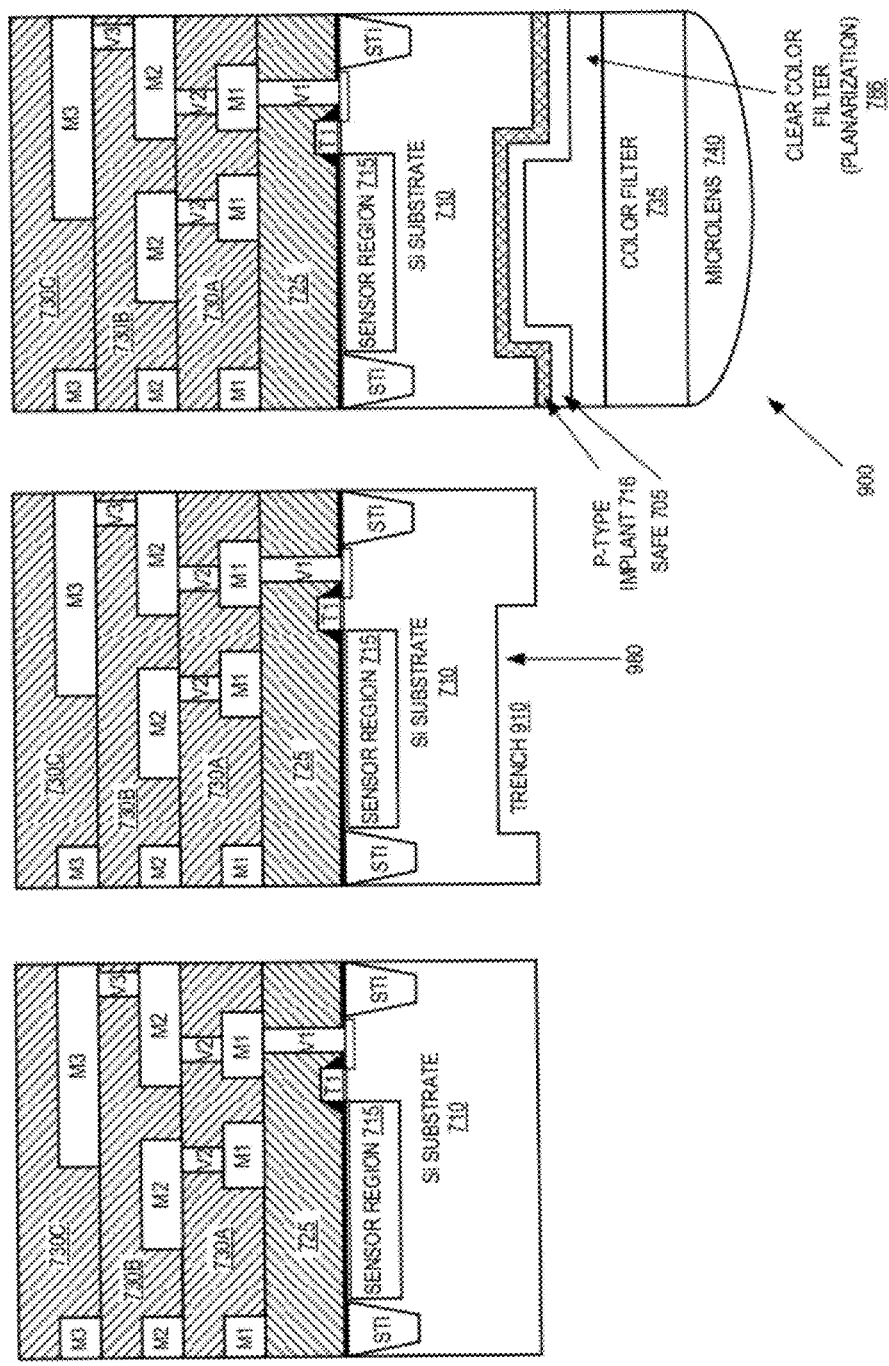

IMAGE SENSOR WITH BURIED SELF ALIGNED FOCUSING ELEMENT

CROSS-REFERENCE TO RELATED APPLICATIONS

This application is a continuation-in-part application of U.S. application Ser. No. 12/030,055 filed on Feb. 12, 2008.

TECHNICAL FIELD

This disclosure relates generally to image sensors, and in particular but not exclusively, relates to CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors, and in particular, CMOS image sensors ("CIS"), has continued to advance at great pace. For example, the demands of higher resolution and lower power consumption have encouraged the further miniaturization and integration of these image sensors. FIG. 1 illustrates a conventional CIS module 100. CIS module 100 operates by illuminating object 105 with light sources 110 (e.g., multicolor LEDs). The light reflected off object 105 is focused onto a CIS array 115, which includes a two dimensional array of optical sensors. Once the impinging image is captured, pixel array 115 outputs analog image data 120 to a digital processing unit 125. Digital processing unit 125 includes analog-to-digital ("ADC") circuitry to convert analog image data 120 to digital image data 130. Finally, digital image data 130 may be subsequently stored, transmitted, or otherwise manipulated by software/firmware logic 135.

As the process technology for fabricating CIS array 115 continues to advance into sub 2.2 micron pixel designs, focusing light into the individual photodiodes of CIS array 115 and reducing crosstalk between the pixels has become increasingly difficult. This difficulty arises due to the relatively small open metal area above each photodiode in CIS array 115. Conventional techniques for increasing the sensitivity and reducing cross talk include shrinking the height of the back end metal stack (metal and dielectric layers) above the photodiode and/or incorporating an embedded microlens. The metal stack height, including the intermetal dielectric layers, is constrained by the capacitive coupling of consecutive metal layers. This coupling adversely affects circuit timing and gain. Therefore reducing the metal stack height to increase sensitivity can negatively affect many aspects of CIS performance. Using an embedded microlens, that is, a microlens below the traditional top microlens in the inter-metal dielectric layers, adds significant process complexity. For instance, the top microlens is formed of polyimides, which cannot withstand the typical processing temperatures used during the deposition of the metal stack layers and therefore cannot be used to fabricate embedded microlenses. In addition, alignment of an embedded microlens to the top microlens and to the surface of the photodiode is difficult and increases in difficulty as the photodiode apertures continue to decrease in sub 2.2 micron CIS technology.

BRIEF DESCRIPTION OF THE DRAWINGS

It should be appreciated that the figures are merely intended as illustrative and not necessarily drawn to scale. Furthermore, the materials and dimensions disclosed above are not intended to be an exhaustive list of alternatives nor a listing of exclusive fabrication materials. Rather, one of ordinary skill having the benefit of the instant disclosure will appreciate that various substitute materials and/or alternative dimensions may be implemented.

FIG. 6A-C illustrates various intermediate fabrication steps of a CIS having a deep buried SAFE, in accordance with an embodiment of the invention.

FIGS. 9A-C illustrate various intermediate fabrication steps of a BSI CIS having a buried SAFE, in accordance with an embodiment of the invention.

DETAILED DESCRIPTION

Embodiments of a complementary metal-oxide-semiconductor ("CMOS") image sensor ("CIS") with a buried self aligned focusing element ("SAFE") are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2:
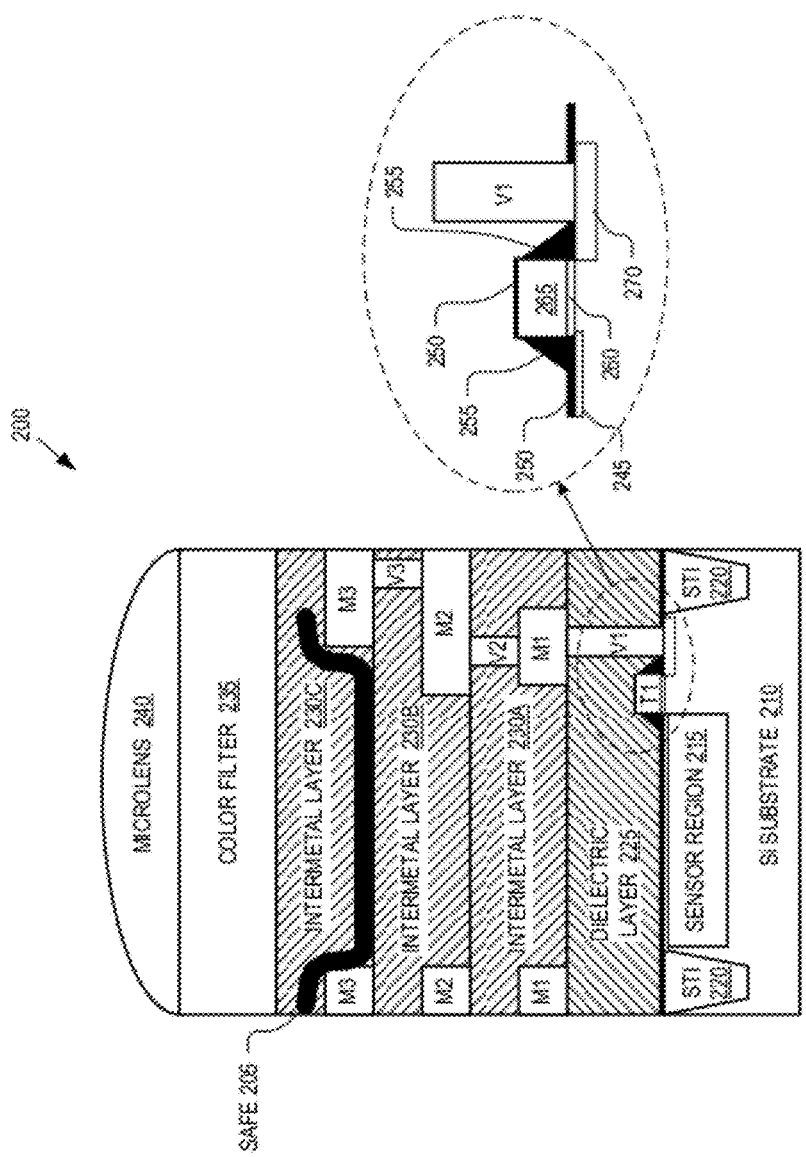
FIG. 2 is a cross sectional view of a CIS with buried self aligned focusing element ("SAFE"), in accordance with an embodiment of the invention.

FIG. 2 is a cross sectional view of a CIS 200 with a buried self aligned focusing element ("SAFE"), in accordance with an embodiment of the invention. The illustrated embodiment of CIS 200 includes a SAFE 205, a semiconductor substrate 210, an optical sensor region 215, shallow trench isolations ("STIs") 220, a transfer transistor T1, metal vias V1, V2, and V3, dielectic layer 225, inter-metal dielectric layers 230A, 230B, and 230C, metal layers M1, M2, and M3, color filter 235, and microlens 240. The illustrated embodiment of transfer transistor T1 includes a pinning or surface passivation layer 245, an oxide silicide blocking layer 250, oxide spacers 255, a gate oxide 260, a gate electrode 265, and a diffusion region 270. CIS 200 is an example of a front side illuminated ("FSI") image sensor, in an FSI CIS, incident light approaches optical sensor region 215 from the front side of semiconductor substrate 210.

As the pixel size of CIS continue to scale below 2.2 µm, focusing light into optical sensor region 215 is increasingly difficult. This is due to the relatively narrow optical passthroughs in each metal layer that form an optical path through the metal stack (e.g., inter-metal dielectric layers 230, dielectric layer 225, and metal layers M1-M3) down to the surface of optical sensor region 215. The metal stack can be greater than 4 µm high, while the diameter of the optical passthroughs can be less than 1.5 µm wide. As such, microlens 240 alone may not be sufficient to optimally focus incident light onto the surface of optical sensor region 215. Conventional CIS have attempted to address this by removing metal layers to reduce the metal stack height. However, removing metal layers limits the transistor count of the image sensor and forces metal layer M3 circuitry to be moved to metal layer M2. This can crowd metal layer M2, causing metal layer M2 to further encroach on the optical path.

Figure 3B:
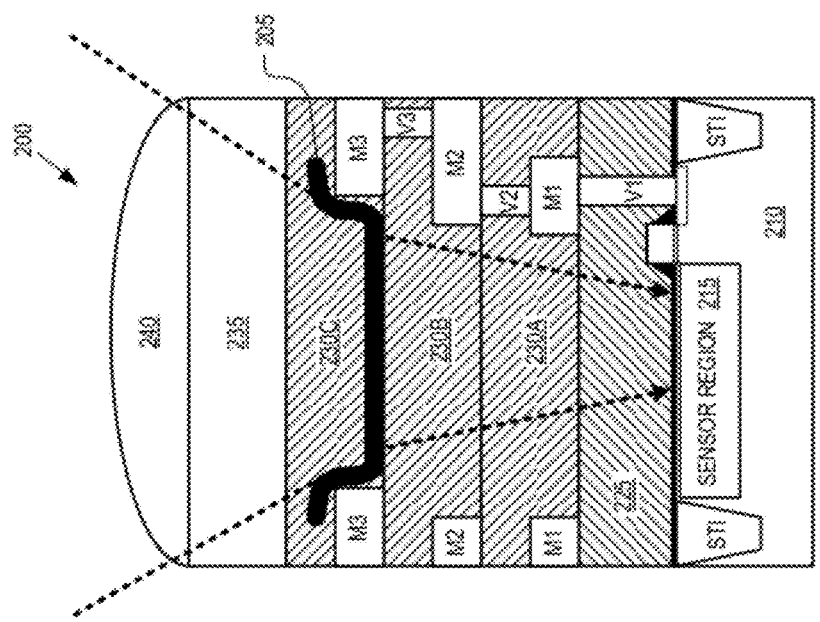
FIG. 3B is a cross sectional view of a CIS with buried SAFE illustrating how impinging light refocused by the buried SAFE onto the sensor region, in accordance with an embodiment of the invention.
Figure 3A:
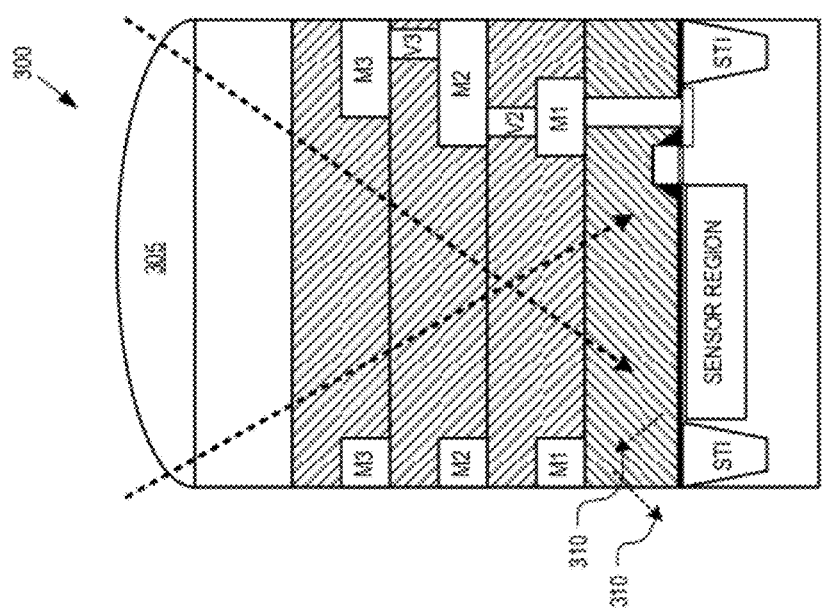
FIG. 3A is a cross sectional view of a CIS without a buried SAFE illustrating how impinging light is focused above the sensor region.

FIG. 3A illustrates a CIS 300 without a buried focusing element. As illustrated, the incident light tends to be focused at a point above the surface of the optical sensor region. As the light continues deeper into CIS 300 past the focal point of microlens 305, it begins to diverge. The divergent or out-of-focus light reduces the sensitivity of CIS 300 and increases cross-talk between adjacent pixels in an array of CIS 300. The reduced sensitivity is a result of the intensity reduction that occurs as the incident light diverges past the focal length of microlens 305. The greater the degree of blurriness or malfocus, the lower the intensity of the light striking the optical sensor region. To aggravate matters, as the light diverges, its angle of incidence with the dielectric layers of the metal stack (as measured from a surface's normal) increases, resulting in a greater portion of the light being reflected at refractive boundaries between the dielectric layers within CIS 300. This reflected light can even bounce off the metal layers M1, M2, or M3 into adjacent pixels, as illustrated by reflected light 310. Reflected light results in detrimental cross-talk between pixels of a CIS array.

In contrast, CIS 200 includes a buried SAFE 205 to better focus light incident on CIS 200 and improve the optical efficiency of the device. As illustrated in FIG. 3B, SAFE 205 extends the focal length of microlens 240. Light penetrating the optical path between metal layers M1, M2, and M3 maintains its intensity deeper into metal the stack, thereby increasing the sensitivity of CIS 200. Furthermore, since the light does not diverge within the optical path, reflections are reduced and crosstalk between adjacent pixels diminished. By burying one or more SAFEs 205 into the metal stack, higher stacks with greater numbers of metal layers can be used, while maintaining CIS sensitivity. Increasing the number of metal layers can enable higher resolution pixel arrays and higher transistor count image sensors (e.g., 4 transistor, 5 transistor, or higher).

Returning to FIG. 2, embodiments of CIS 200 are fabricated with the following materials. In one embodiment, semiconductor substrate 210 is a silicon substrate while diffusion region 270 and optical sensor region 215 are N-type doped. Optical sensor region 215 may be formed using a variety of photosensitive structures, such as a photodiode. Optical sensor region 215 and transfer transistor T1 include oxide insulating layers, such as oxide silicide blocking layer 250, oxide spacers 255, and gate oxide 260. Vias V1-V3 conductively link metal layers M1-M3 and may be fabricated of a variety of metals, including tungsten. Metal layers M1-M3 (approx 5000 angstroms thick) may also be fabricated of a variety of metals, including aluminum. Each dielectric layer within the metal stack may be formed of a deposited oxide (e.g., silicon oxide) approximately 1 µm thick, for a total metal stack height of approximately 4 µm thick. SAFE 205 may be fabricated of a material having a higher index of refraction than its surrounding dielectric layers, such as silicon nitride, silicon oxynitride, organic polyimide, high index polyimides, or otherwise. In one embodiment, SAFE 205 is approximately 500 to 2000 angstroms thick. Color filter 235 may be a color sensitive organic polyimide, while microlens 240 may be fabricated of a clear polyimide material.

It should be appreciated that FIG. 2 is merely intended as illustrative and not necessarily drawn to scale. Furthermore, the materials and dimensions disclosed above are not intended to be an exhaustive list of alternatives nor a listing of exclusive fabrication materials. Rather, one of ordinary skill having the benefit of the instant disclosure will appreciate that various substitute materials and/or alternative dimensions may be implemented.

Figure 4:
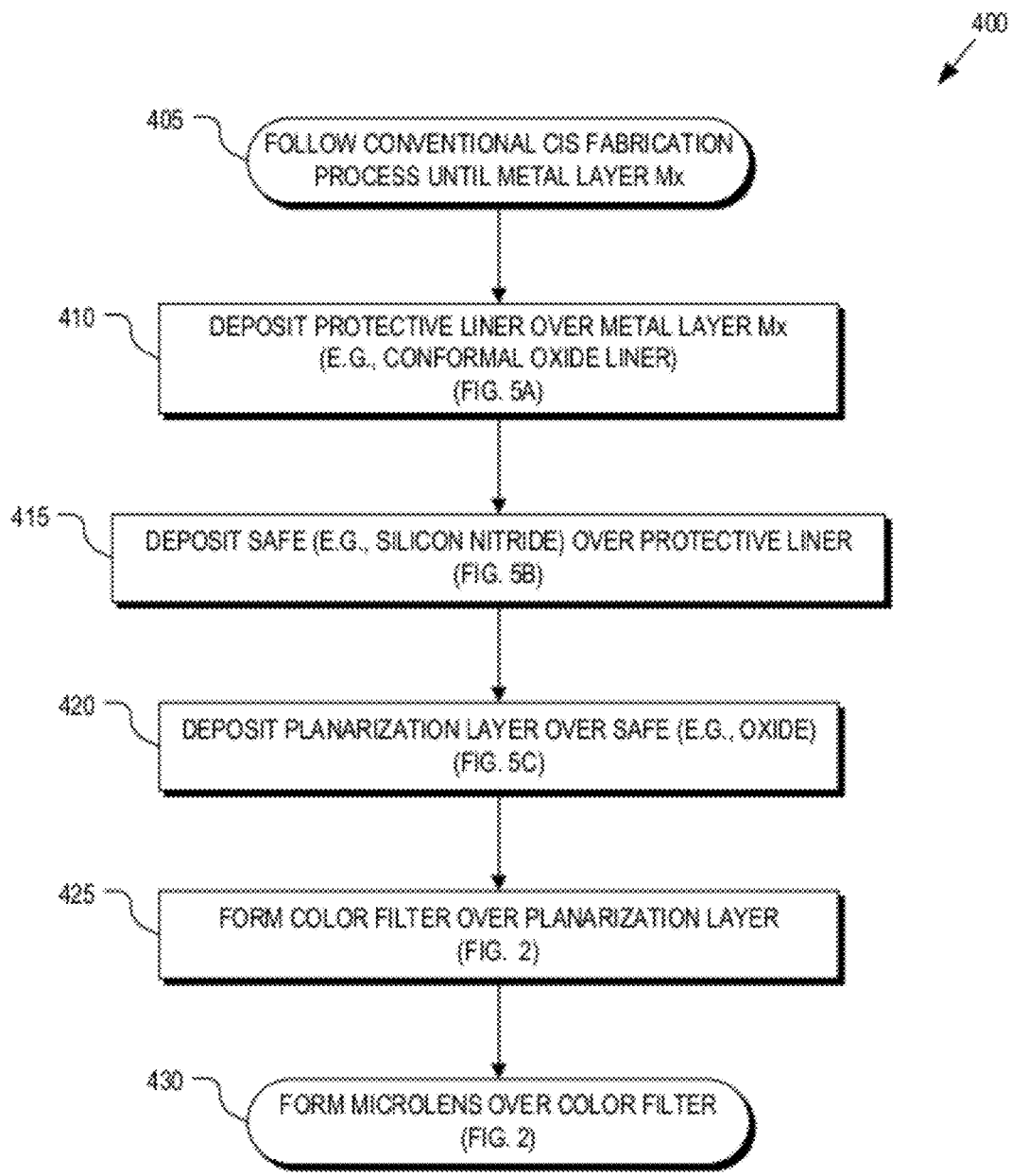
FIG. 4 is a flow chart illustrating a process for fabricating a CIS with buried SAFE, in accordance with an embodiment of the invention.

FIG. 4 is a flow chart illustrating a process 400 for fabricating CIS 200, in accordance with an embodiment of the invention. The order in which some or all of the process blocks appear in process 400 should not be deemed limiting. Rather, one of ordinary skill in the art having the benefit of the present disclosure will understand that some of the process blocks may be executed in a variety of orders not illustrated, or even left out entirely.

Figure 5C:
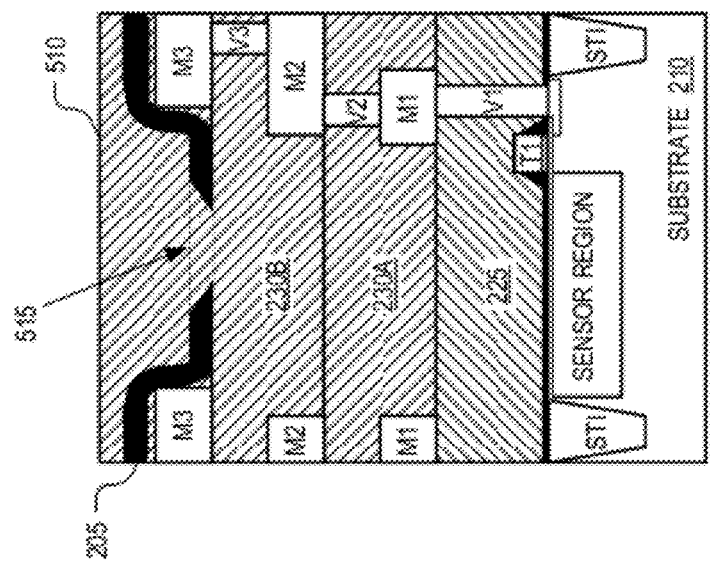
FIGS. 5A-C illustrates various intermediate fabrication steps of a CIS with buried SAFE, in accordance with an embodiment of the invention.

The fabrication of CIS 200 follows conventional fabrication until the first metal layer Mx upon which SAFE 205 is disposed. In the illustrated embodiment, SAFE 205 is disposed on the top metal layer M3; however, it should be appreciated that SAFE 205 may be disposed over lower metal layers (e.g., M2 or M1) and multiple SAFE 205 may even be included within a single metal stack. As illustrated in FIG. 5A, the initial fabrication processes may include forming optical sensor region 215 between STIs 220 within substrate 210. Subsequently, transfer transistor T1 is formed to couple optical sensor region 215 to via V1 through diffusion region 270. Dielectric layer 225 is the first dielectric layer of the metal stack disposed over optical sensor region 215. Once deposited, via V1 is etched and backfilled with metal, and then the higher inter-metal dielectric layers 230 and metal layers M1, M2, and M3 are deposited and etched in an iterative manner to build up the constituent layers of the metal stack. Each metal layer is patterned to form optical passthroughs aligned with optical sensor region 215 to expose an optical path through the metal stack from the top dielectric layer down to optical sensor region 215. In one embodiment, the optical pass-throughs are approximately 1.5 µm to 1.6 µm in diameter. Of course, other diameters may also be implemented. When metal layer Mx (the metal layer upon which SAFE 205 is to be formed) is reached, fabrication of CIS 200 diverges from conventional techniques. However, it should also be appreciated that embodiments of the present invention enable smaller pixel designs with a greater number of metal layers than conventional CIS techniques when one or more SAFEs are buried within the metal stack.

In a process block 410, a protective liner 505 is deposited over metal layer Mx (illustrated as metal layer M3). In one embodiment, protective liner 505 is a conformal oxide liner that conforms to the topography of the patterned metal layer Mx below it. Since the topography of metal layer Mx shapes protective liner 505, metal layer Mx (and any other metal layer that resides immediately below a buried focusing element, such as SAFE 205) is referred to as the "conforming metal layer."

Figure 5B:
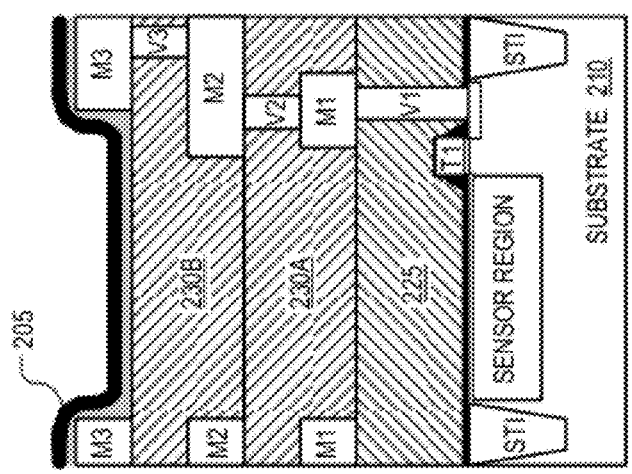
Figure 5A:
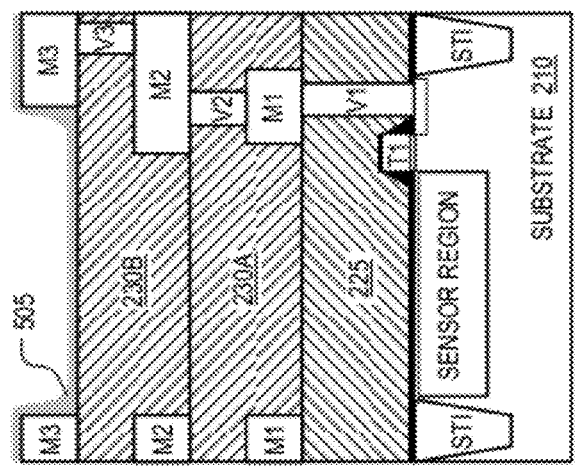

In a process block 415, SAFE 205 is deposited over protective liner 505 (see FIG. 5B). Since protective liner 505 is a relatively thin layer that conforms to the conforming metal layer M3, SAFE 205 is also self aligned to the conforming metal layer M3. When SAFE 205 is deposited, a curved surface or lens is formed in the optical path and self aligns to the optical pass-through of the conforming metal layer M3. Protective liner 505 may also be used as an additional degree of freedom to manipulate the lens characteristics of SAFE 205. For example, the thickness of protective liner 505 will affect the shape and degree of curvature of SAFE 205. Other mechanisms for shaping SAFE 205 include the height of the conforming metal layer M3, the amount of over etch between metal lines, and the thickness of SAFE 205 itself. Accordingly, neither intricate processes nor active alignment is necessary to form and align the lens forming curvature of SAFE 205. The optical characteristics of SAFE 205, including its curvature, can be optimized for a given architecture, application, pixel dimension, and metal stack height.

In a process block 420, a planarization layer 510 is deposited over SAFE 205. In one embodiment, planarization layer 510 is simply the continuation of inter-metal dielectric layer 230C. In a process block 425, color filter 235 is disposed over planarization layer 510. In a process block 430, microlens 240 is formed over color filter 235 on the top surface of CIS 200 (see FIG. 2).

In one embodiment, SAFE 205 may be a blanket high index layer embedded in the dielectric stack, which conforms to its underlying conforming metal layer. In this embodiment, SAFE 205 may operate as a dual purpose layer to act as both a buried focusing element within the optical path and as a passivation blanket layer over the conforming metal layer. In one embodiment, SAFE 205 may be patterned or etched to remove portions that fall outside of the optical path or optical pass-through of its conforming metal layer. In yet another embodiment, SAFE 205 may optionally be etched in a middle portion 515, to enable further lens shaping flexibility (see FIG. 5C).

FIGS. 6A-6C illustrate the fabrication of an alternative embodiment of a CIS 600 including a variable depth SAFE 605. The variable depth SAFE 605 enables SAFE 605 to be buried below its conforming metal layer and provides an additional degree of freedom to define its shape to improve CIS sensitivity and reduce crosstalk between adjacent pixels.

Referring to FIG. 6A, fabrication of CIS 600 again follows conventional CIS fabrication processes up to metal layer Mx (the conforming metal layer, or M3 in the embodiment illustrated in FIG. 6A). At this point, using the conforming metal layer as a mask, a trench 610 is etched into the inter-metal dielectric layer (illustrated as inter-metal dielectric layer 230B) upon which the conforming metal layer is disposed and extends below the conforming metal layer (see FIG. 6B). Subsequently, a protective liner, SAFE 605, a planarization layer (e.g., inter-metal dielectric layer 230C), color filter 235, and microlens 240 are formed over the conforming metal layer and trench 610 (similar to process 400), as illustrated in FIG. 6C.

Figure 7A:
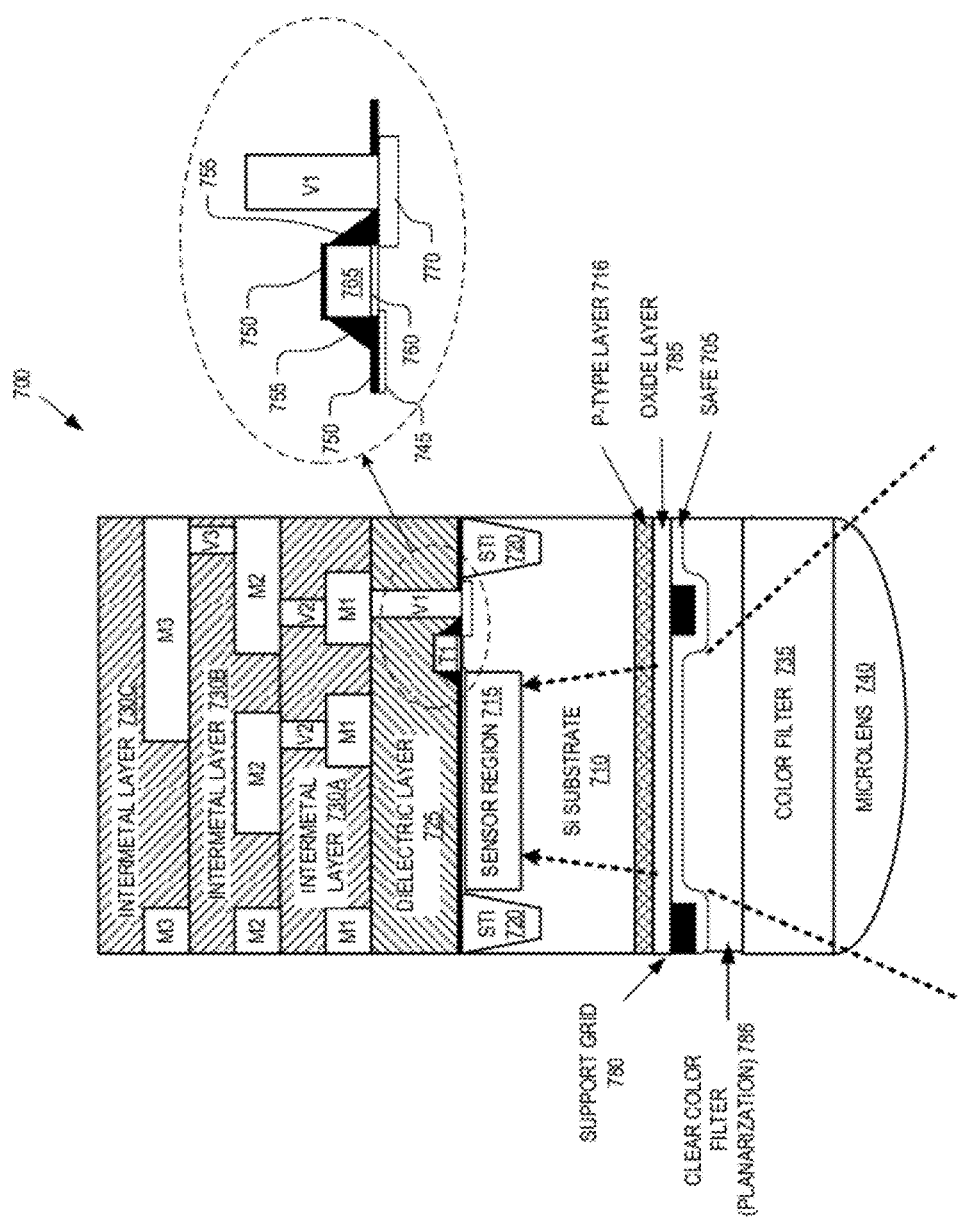
FIG. 7A is a cross sectional view of a backside illuminated ("BSI") CIS with an embedded SAFE, in accordance with an embodiment of the invention

FIG. 7A illustrates a cross sectional view of a Backside Illuminated (BSI) CIS 700 with an embedded SAFE, in accordance with another embodiment. BSI refers to the illumination of the sensor region of the photodiode on the surface of the exposed semiconductor substrate (i.e., the backside). In BSI CIS, illumination occurs without interference from any metal or dielectric layers that form, for example, the transistor components of the pixel cell and associated interconnects, allowing incident light a more direct path through the photodiode. In FSI, the sensor region of the photodiodes formed on the side of the semiconductor substrate closest to the polysilicon, dielectric and metal layers such that care must be taken to ensure that the sensor region of an FSI pixel cell is not covered by polysilicon or metal layers.

The illustrated embodiment of BSI CIS 700 includes a SAFE 705, a support grid 780, a semiconductor substrate 710, an optical sensor region 715, a p-type layer 716, STIs 720, a transfer transistor T1, metal vias V1, V2 and V3, a dielectric layer 725, inter-metal layers 730A, 730B and 730C, metal layers M1, M2 and M3, color filter 735, microlens 740 and clear color filter (planarization layer) 786. The illustrated embodiment of transfer transistor T1 includes a pinning or surface passivation layer 745, an oxide silicide blocking layer 750, oxide spacers 755, a gate oxide 760, a gate electrode 765 and a diffusion region 770.

BSI CIS differs from FSI CIS in that the optical path of incident light to the optical sensor region is through the backside of the image sensor, and therefore, there are fewer limitations to the placement of metal layers on the front side of the image sensor. Support grid 780 supports SAFE 705 and is formed on the backside of the image sensor. The embedded focusing element (e.g., SAFE 705) is configured to define an optical path from the focusing element through to the optical sensor region (e.g., sensor region 715). Oxide layer 785 separates p-type layer 716 from support grid 780 and SAFE 705. Similarly to previously described embodiments, SAFE 705 effectively extends the focal length of microlens 740.

Support grid 780 may be composed of any material which can support SAFE 705, such as an opaque metal such as aluminum. In some embodiments, support grid 780 may provide the added benefit of reducing the occurrence of cross talk by providing an optically opaque barrier between adjacent pixels. In some embodiments, support grid 780 may be composed of a non-opaque and/or a non-metal material. In some embodiments, embedded SAFE 705 may eliminate the need for microlens 740 by diverting incident light from the edges of SAFE 705 (i.e., area of SAFE 705 closest to support grid 780) to sensor region 715.

Figure 1:
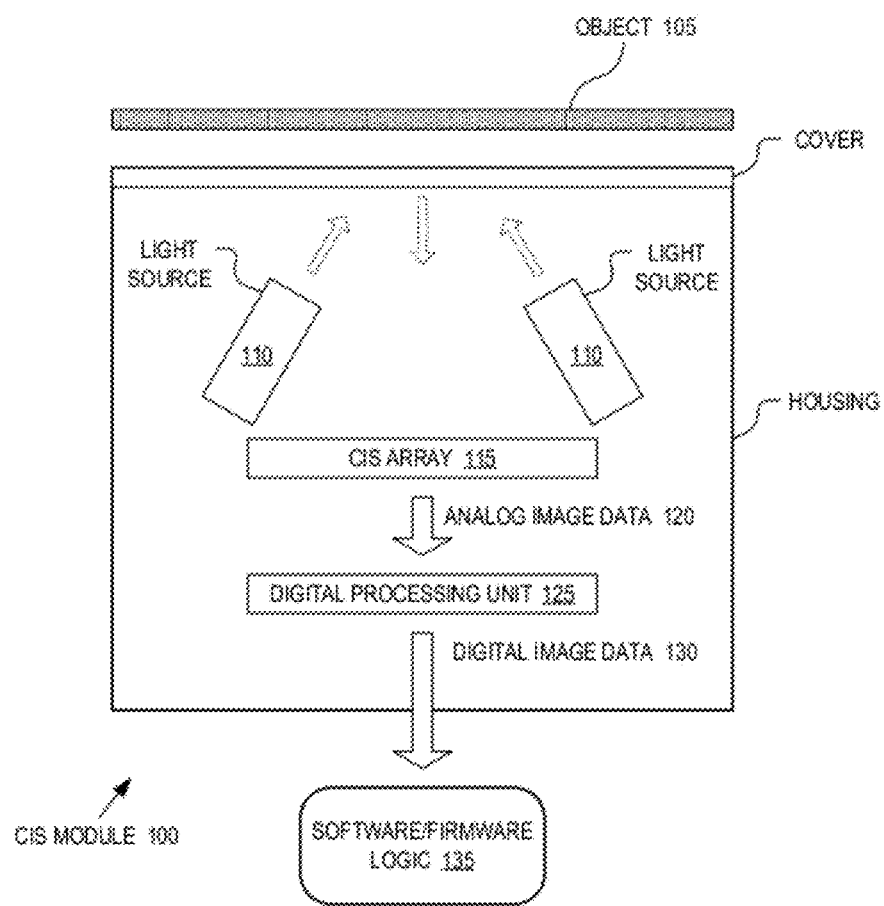
FIG. 1 is a functional block diagram illustrating a conventional CMOS image sensor ("CIS").
Figure 7B:
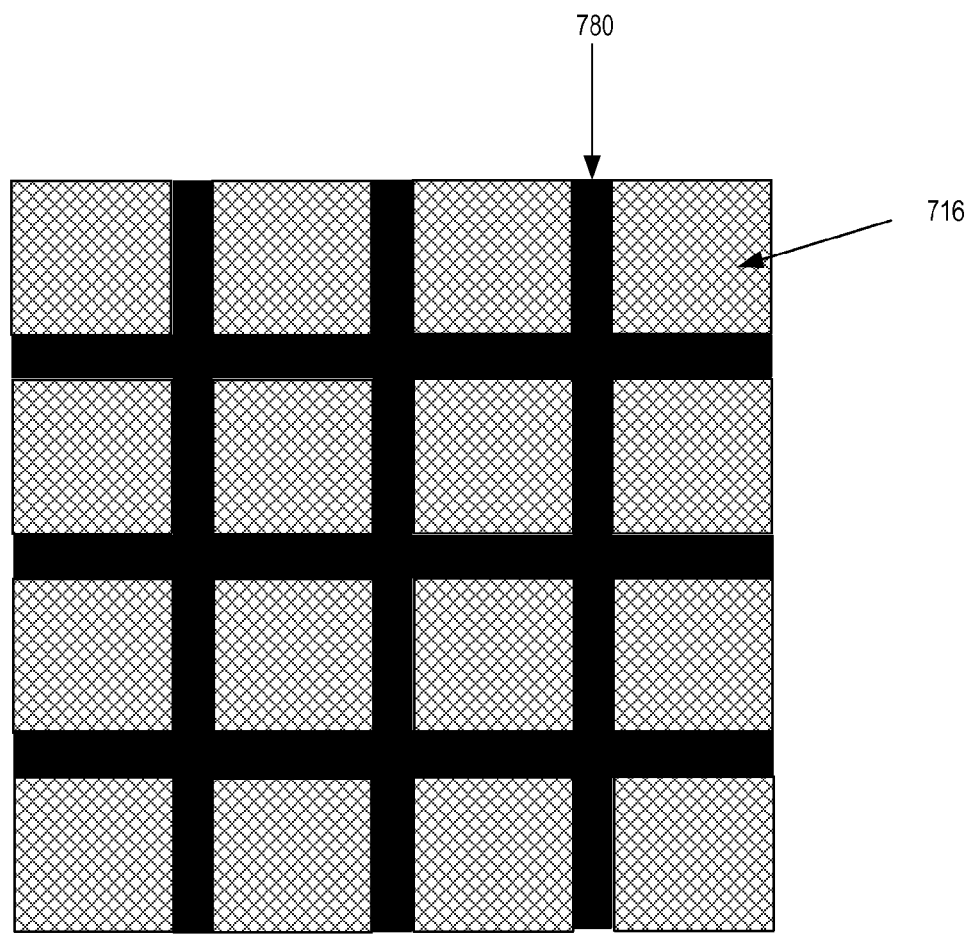
FIG. 7B is a planar view of a backside of a BSI CIS, showing the layout of the support grid, in accordance with an embodiment of the invention.

FIG. 7B illustrates a planar view of the backside of BSI CIS 700. In this figure, 16 pixel cells of CIS array 115 (from FIG. 1) can be seen. In this view, only p-type layer 716 is visible. The placement of support grid 780 enables the reduction of crosstalk by providing a barrier between adjacent pixels.

Figure 8:
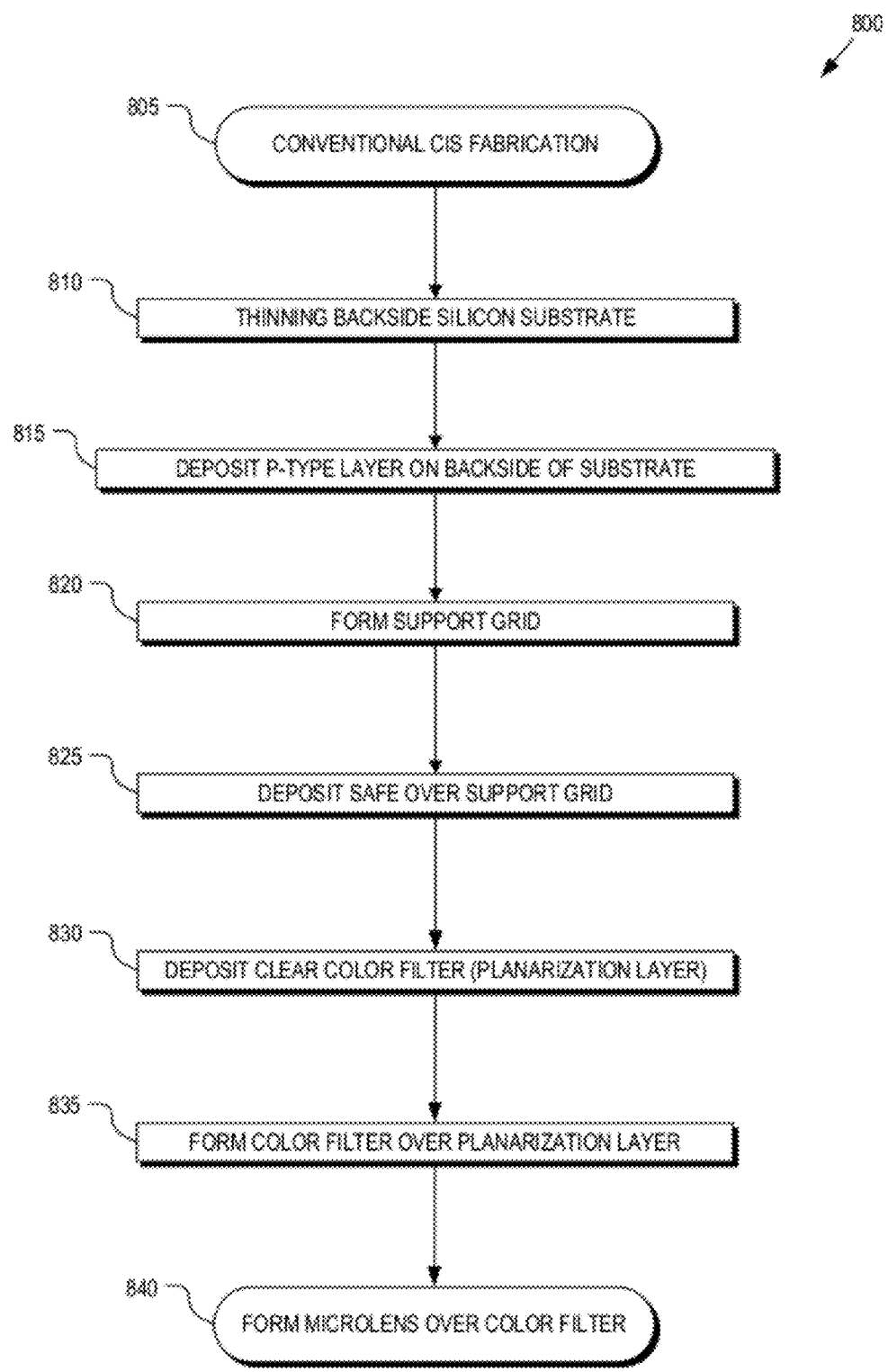
FIG. 8 is a flow chart illustrating a process for fabricating a BSI CIS with an embedded SAFE, in accordance with an embodiment of the invention

Referring now to FIG. 8 in conjunction with FIG. 7A, FIG. 8 is a flow chart illustrating a process 800 for fabricating BSI CIS 700, in accordance with an embodiment. The order in which some or all of the process blocks appear in process 800 should not be deemed limiting. Rather, one of ordinary skill in the art having the benefit of the present disclosure will understand that some of the process blocks may be executed in a variety of orders not illustrated, or even left out entirely.

In a process block 805, the fabrication of BSI CIS 700 follows conventional fabrication, except there are fewer limitations on the placement of metal layers on the front side of the CIS. In process block 810, the backside of semiconductor substrate 710 of FIG. 7A is made thinner, thereby reducing the amount of silicon through which incident light traverses before the sensing region of the image sensor is encountered.

In process block 815, a p-type dopant such as boron is deposited onto the backside of the thinned semiconductor substrate to form p-type layer 716. In process block 820, a support grid 780 is formed on the backside of the thinned semiconductor substrate. In process block 825, SAFE 705 is deposited on support grid 780. In process block 830, a clear color filter, or planarization layer 786 is deposited on the SAFE 705. In process block 835, color filter 735 is formed on the planarization layer 786. In process block 840, microlens 740 may be formed on color filter 735.

FIGS. 9A-9C illustrate the fabrication steps of another embodiment, where the support grid is integrally formed from semiconductor substrate 710. Referring to FIG. 9A, fabrication of BSI CIS 900 again follows conventional CIS fabrication steps. A trench 910 is etched into semiconductor substrate 710, as seen in FIG. 9B. The trench is located in an area under optical sensor region 715, such that exposed surface 980 of trench 910 supports SAFE 705. The location and alignment of SAFE 705 is chosen such that an optical path is defined from SAFE 705 to optical sensor region 715.

Referring to FIG. 9C, in subsequent processing steps p-type layer 716 and SAFE 705 are formed, resulting in p-type layer 716 and SAFE 705 conforming to the shape of trench 910. In this embodiment, exposed trench surface 980 functions similarly to support grid 780 in FIG. 7A. Subsequently, clear color filter or planarization layer 786, color filter 735 and optional microlens 840 are formed on SAFE 705, as illustrated in FIG. 9C.

The above description of illustrated embodiments, including what is described in the Abstract, is not intended to be exhaustive or to limit the embodiments to the precise forms disclosed. While specific embodiments and examples are described herein for illustrative purposes, various modifications are possible within the present scope, as those skilled in the relevant art will recognize.

These modifications can be made to the illustrated embodiments in light of the above detailed description. The terms used in the following claims should not be construed to limit the invention to the specific embodiments disclosed in the specification. Rather, the scope is to be determined entirely by the following claims, which are to be construed in accordance with established doctrines of claim interpretation.

What is claimed is:

1. A backside illuminated ("BSI") image sensor, comprising:
   an optical sensor region disposed within a semiconductor substrate;
   a stack of dielectric layers and metal layers disposed on a front side of the semiconductor substrate above the optical sensor region;
   a support grid disposed on a backside of the semiconductor substrate, the support grid defining an optical pass-through that is aligned to expose an optical path through the backside of the semiconductor substrate to the optical sensor region from the optical pass-through in the support grid; and
   an embedded focusing element disposed over the support grid and the optical pass-through defined by the support grid, the embedded focusing element having a curved surface shaped by the support grid and the optical pass-through defined by the support grid to focus light incident on the backside and to direct the light along the optical path into the optical sensor region.

2. The BSI image sensor of claim 1, further comprising a planarization layer disposed on a backside of the embedded focusing element.

3. The BSI image sensor of claim 2, further comprising a microlens disposed on a backside of the planarization layer in alignment with the optical path.

4. The BSI image sensor of claim 3, wherein the image sensor comprises a complementary metal-oxide-semiconductor ("CMOS") image sensor, the CMOS image sensor further comprising a color filter disposed between the microlens and the embedded focusing element.

5. The BSI image sensor of claim 2, wherein the embedded focusing element comprises a silicon nitride layer.

6. The BSI image sensor of claim 1, wherein the support grid is comprised of metal.

7. The BSI image sensor of claim 1, wherein the support grid is integrally formed from the semiconductor substrate.

8. A method for fabricating a complementary metal-oxide-semiconductor ("CMOS") backside illuminated ("BSI") image sensor, the method comprising:
   forming an optical sensor region within a semiconductor substrate;
   forming a stack of dielectric layers and metal layers above the optical sensor region;
   forming a support grid on a backside of the semiconductor substrate opposite the stack of dielectric layers and metal layers, the support grid defining an optical pass-through that is aligned to expose an optical path through the backside of the semiconductor substrate to the optical sensor region from the optical pass-through in the support grid; and
   forming an embedded focusing layer on a backside of the support grid and over the optical pass-through defined by the support grid, the embedded focusing layer having a curved surface shaped by the support grid and the optical pass-through defined by the support grid to focus light incident on the backside and to direct the light along the optical path into the optical sensor region.

9. The method of claim 8, wherein forming the embedded focusing layer comprises depositing a layer of silicon nitride.

10. The method of claim 8, further comprising:
    forming a color filter layer on a backside of the embedded focusing layer; and
    forming a microlens on a backside of the color filter layer aligned with the optical path.

11. The method of claim 8, wherein forming the support grid comprises:
    forming a metal support grid on the backside of the semiconductor substrate.

12. The method of claim 8, wherein forming the support grid comprises:
    etching a trench on the backside of the semiconductor substrate in locations under the optical sensing region, wherein the support grid comprises the semiconductor substrate.

* * * * *